United States Patent

Pine et al.

[11] Patent Number: 5,195,234
[45] Date of Patent: Mar. 23, 1993

[54] METHOD AND APPARATUS FOR VISUAL ALIGNMENT OF PARTS

[75] Inventors: Jerrold S. Pine; Stefan Peana; Daniel Peana, all of Boca Raton, Fla.

[73] Assignee: Motorola, Inc., Schaumburg, Ill.

[21] Appl. No.: 747,089

[22] Filed: Aug. 19, 1991

[51] Int. Cl.⁵ .................. B23P 21/00; B23P 19/00
[52] U.S. Cl. ............................ 29/720; 29/739; 29/743
[58] Field of Search ............... 29/720, 721, 739, 740, 29/741, 743, 744; 901/9, 46, 47

[56] References Cited

U.S. PATENT DOCUMENTS

| | | | |
|---|---|---|---|
| 4,163,309 | 8/1979 | Stückler | 29/720 X |
| 4,222,036 | 9/1980 | Troukens | 29/720 X |
| 4,404,741 | 9/1983 | Lebet et al. | 29/721 |
| 4,437,114 | 3/1984 | LaRussa | |
| 4,598,456 | 7/1986 | McConnell | 29/721 X |
| 4,608,494 | 8/1986 | Kobayashi et al. | 29/721 X |
| 4,628,464 | 12/1986 | McConnell | 29/721 X |
| 4,867,569 | 9/1989 | Mohara | 29/721 X |
| 4,896,418 | 1/1990 | Yearsley | 29/720 X |
| 4,973,216 | 11/1990 | Domm | |
| 5,084,959 | 2/1992 | Ando et al. | 29/720 X |

OTHER PUBLICATIONS

IBM Technical Disclosure Bulletin, SMT-MLC Placement Machine, Mar. 1992.

*Primary Examiner*—Timothy V. Eley
*Attorney, Agent, or Firm*—Pablo Meles; Thomas G. Berry

[57] ABSTRACT

An apparatus (10) for visually aligning parts (13) for placement using one camera (18) comprises a device (12) for picking and placing a part on an object (15), a device (24, 26 & 28) for moving and removing optics (30, 36, 38) into and out of a work envelope having the object, a device (18, 40, 42 & 44) for locating landmarks on the object within the work envelope, and a device for aligning the part with the landmark in the work envelope.

20 Claims, 3 Drawing Sheets

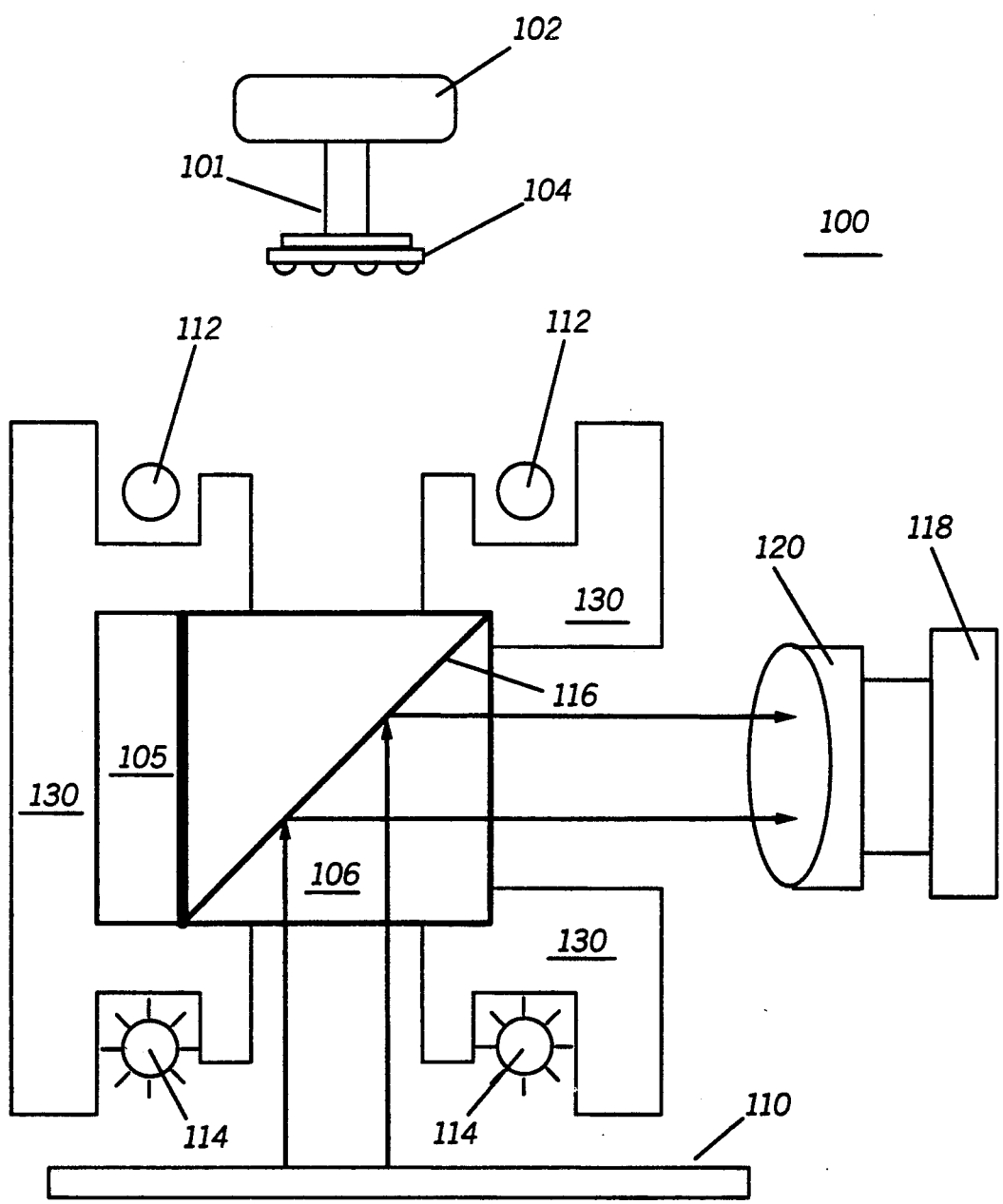

METHOD AND APPARATUS FOR VISUAL ALIGNMENT OF PARTS

TECHNICAL FIELD

This invention relates generally to robotic pick and place stations and in particular, to a robotic gripper for closed loop image guided placement of parts.

BACKGROUND

Traditional vision systems for robotic stations use a dual camera system including associated lighting and lenses. Typically, one fixed camera in the robotic station faces up and views the bottom of a placement part for inspection. A second camera is then typically mounted on the robot arm facing down toward the area where the part is to be placed. More particularly, in electronics, the second camera would be looking down at a printed circuit board having fiducials or landmarks for a standard of reference. The first camera would view the general shape and pitch of an electronic component such as a quad flat pack (QFP), a flip chip, a solder bumped chip carrier, or any other number of fine pitched components. The robotic system would then need to calibrate and adjust to align the coordinates mapped into a pixel coordinate grid from the fixed first camera to the robot's coordinate system. Likewise, the second mobile camera would need to be calibrated and adjusted to the robot's coordinate system. Generally, a robotic system has a 4 axis coordinate system: X (east/west), Y (north/south), Z (up/down), and A (rotation about a central axis).

In actual placement of parts, the dual camera system utilizes both cameras to pick and place the part on a printed circuit board. Generally, as a printed circuit board rides on a conveyor towards a mechanical stop in a work envelope (typically, the area within reach of the robot arm), the robot arm picks a part from a feeder. Then the mobile camera is moved over to the printed circuit board (PCB). With the mobile camera, two fiducials are found on the PCB and the system calculates the robot coordinates of each fiducial. Inside the vision system, a database of the part placement location with respect to the fiducials is stored. The robot moves the part over the fixed camera, and the center and orientation of the part are measured. The placement of the component relies solely on the robot's accuracy to move to the placement location and place the part.

The drawbacks of a dual camera system are evident. The traditional dual camera system provides an "open-loop" placement that relies strictly on the robot's accuracy. The open loop system fails to confirm the actual placement of the part in the desired location. Furthermore, the calibration errors of each of the cameras stack up. In other words, the mobile camera calibration is dependent on the fixed camera's calibration. Another disadvantage of the dual camera system is that the fixed camera is in a remote area away from the placement location, thus requiring an additional robot motion. Finally, the added cost are evident in using two cameras and two calibration fixtures. Thus, a need exists for a cost effective vision system using a closed loop verification scheme.

SUMMARY OF THE INVENTION

An apparatus for visually aligning parts for placement using one camera comprises a device for picking and placing a part on an object, a device for moving and removing optics into and out of a work envelope having the object, a device for locating landmarks on the object within the work envelope, and a device for aligning the part with the landmark in the work envelope.

BRIEF DESCRIPTION OF THE DRAWINGS

FIG. 3 is side view of an alternative apparatus for visually aligning parts for placement using one camera in accordance with the present invention, showing the beamed split image of the object.

DETAILED DESCRIPTION OF THE PREFERRED EMBODIMENT

Figure 1:
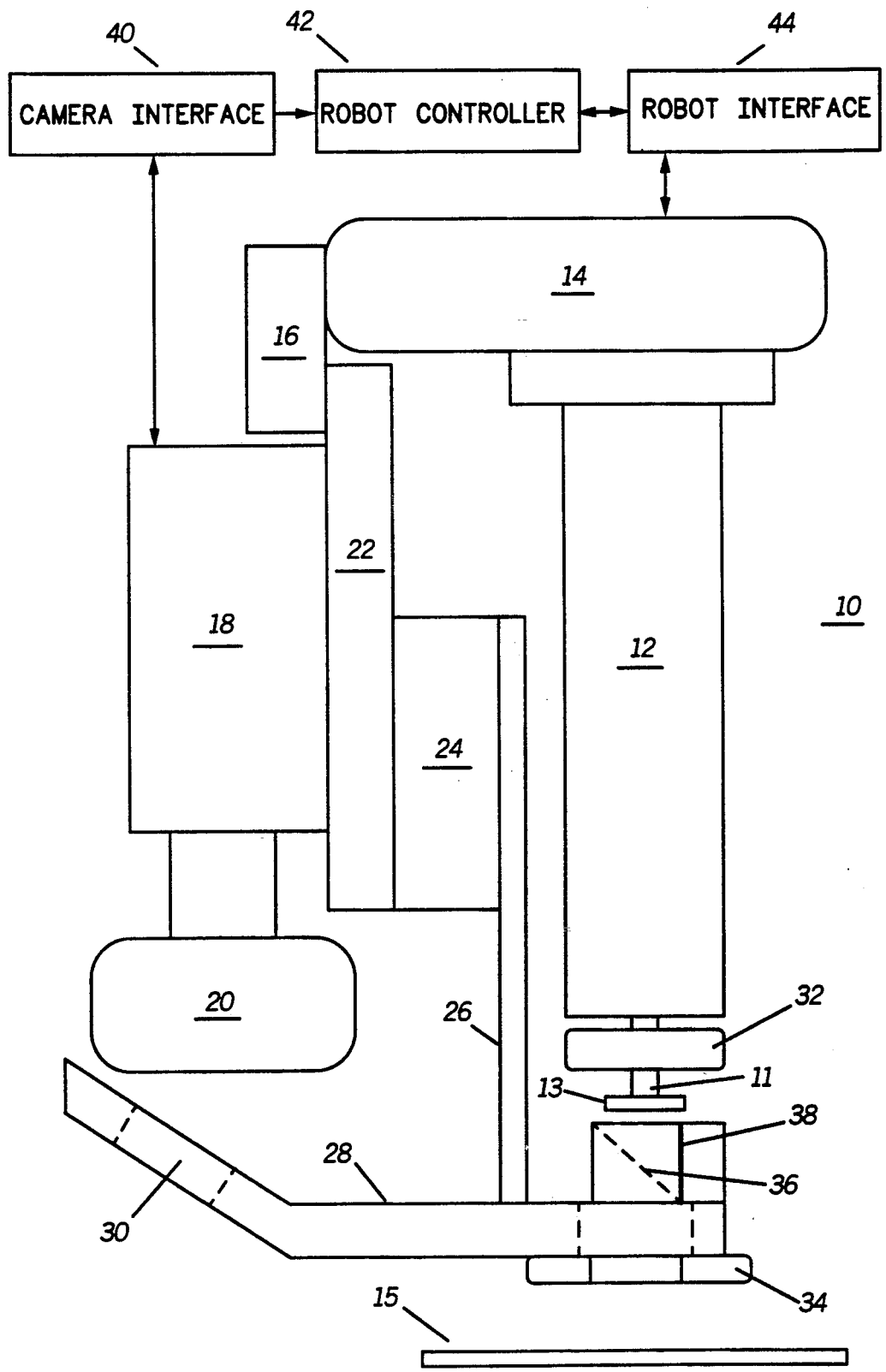
FIG. 1 is a side view of an apparatus for visually aligning parts for placement using one camera in accordance with the present invention.

Referring to FIG. 1, there is shown a side view of an apparatus 10 for visually aligning a part 13 for placement onto an object such as a printed circuit board 15 using one camera (18) in accordance with the present invention. The apparatus preferably comprises a means for picking and placing (12) a part on the object such as a robotic gripper or vacuum tip. The gripper 12 is preferably mounted on a robotic arm A axis plate 14 and coupled to a camera 18 via vertical plates 16 and 22. The apparatus further includes a means for moving and removing (24, 26, and 28) optics (30, 36, and 38) in and out of a imaging envelope (the region between the part 13 and the printed circuit board 15) which allows the apparatus 10 to align the part 13 with the object 15 and then place the part on the object once the optics are removed. The means for moving and removing preferably includes a rotary actuator 24 coupled to an optics support bracket 28 via a beam 26. The rotary actuator rotates the optics in and out of the imaging envelope. The optics preferably include a 45 degree mirror 30, a beam splitter 36 and a first surface mirror 38. The mirror 30 is preferably aligned on the camera's imaging axis below the camera lens 20, the beam splitter is preferably centrally aligned to reflect the camera's imaging axis and below the gripper, and the first surface mirror 38 is likewise preferably centrally aligned to reflect the camera's imaging axis and adjacent to the beam splitter when the optics are placed in the imaging envelope. Preferably, a backlight 32 above a vacuum tip 11 provides sufficient light to provide a shadow image of the component 13. Likewise, an LED ringlamp 34 provides light to reflect off of the PCB 15 so that the images of the PCB 15 and the component 13 can be aligned. The function of the lights become more apparent in the description of FIGS. 2 and 3.

The apparatus 10 operates under the control of a known robot controller 42. The robot controller 42 controls the movements of the robotic gripper 12 through a well known robot interface 44. The gripper 12 can hold a component 13 by any appropriate mechanism, such as holding fingers or a vacuum tip 11 which allows the gripper to hold the component by suction. The component 13 is preferably picked by the gripper 12 from a tray (not shown) for placement onto the printed circuit board 15. Once all the necessary components are placed on the PCB 15, a conveyor (not shown)

preferably moves the PCB 15 and provides the next PCB to be populated.

It is well known that the PCB 15 when positioned on the conveyor may be oriented in any arbitrary position. In order to accurately placed the component 13 on a predetermined area of the PCB 15, the coordinates of the PCB 15 and the component 13 with respect to a reference must be determined. The coordinates of the PCB 15 and the component 13 are provided by converting video pixel data from the camera 18 to Cartesian coordinate data which is applied to the robot interface 44 for movement of the gripper 12. The camera 18 captures the image of the circuit board and the component via a well known camera interface 40, and provides the pixel data to the robot controller 42 for processing. The PCB 15 includes on its surface prepositioned landmarks or fiducials (not shown.) The position of the landmarks are recorded by the camera 18. The robotic controller 42 accurately determines the orientation of the PCB 15 based on the position of the landmarks. Once the orientation of the PCB 15 is determined, the robot controller 42 may also calculate the coordinate of any area on which an electrical component is to be placed.

When a component is picked by the gripper 12, the component 13 may also be in an arbitrary orientation. For accurate placement of the component 13 on the PCB 15, the orientation of the component 13 as held by the gripper 12 and with respect to a reference coordinate, must also be determined. According to the invention, the image of the component 13 and the PCB 15 is deflected by a first surface mirror 38 via the beam splitter 36 towards the 45 degree mirror 30. The deflected image is captured by the camera 18 which located the component 13 and transmits the corresponding pixel data to the robot controller 42. The vision system of the apparatus 10 can be calibrated to establish the relationship between the video pixel data provided by the camera 18 and the Cartesian coordinate system used by the robot gripper 12. A well known software algorithm may be programmed to be executed by the robot controller 42 to achieve the calibration of the vision system. The calibration program would be written to accommodate for the variation of particular parameters and distortions with optics as is known in the art.

Operationally, the gripper 12 picks the part 13, rotates (24, 26, 28) the optics (30, 36, 38), into an imaging envelope area above the PCB 15, and the camera 18 locates the landmarks or fiducials (not shown) on the PCB. The component or part 13 is aligned with the landmarks of the PCB 15. Once the parts are aligned, the optics are rotated away to allow the gripper 12 to place the component 13 onto the desired location on the PCB.

Figure 2:
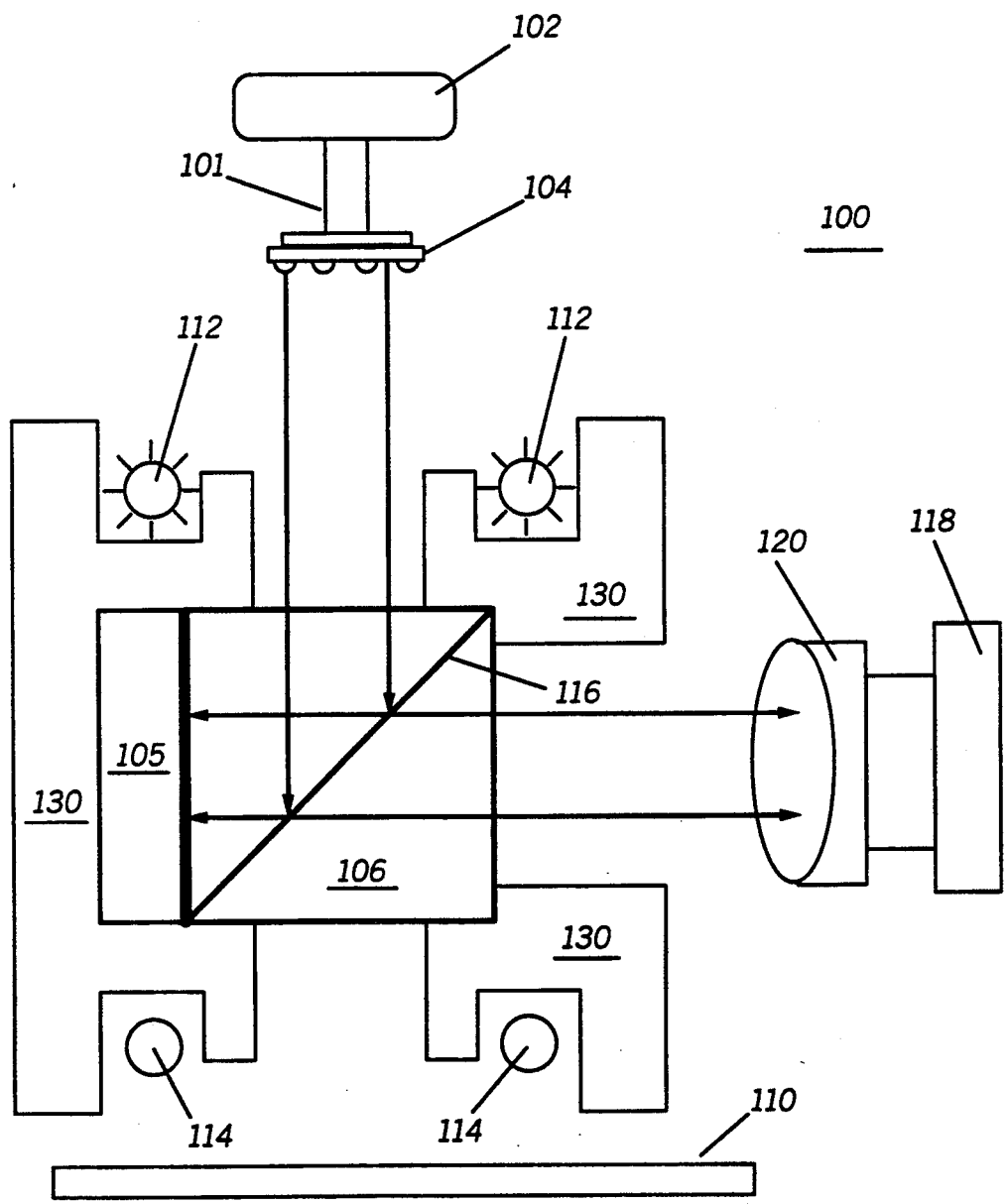
FIG. 2 is a side view of an alternative apparatus for visually aligning parts for placement using one camera in accordance with the present invention, showing the beamed split image of the part.

Referring to FIGS. 2 and 3, emphasis is given to the concurrent imaging aspect of the present invention. An apparatus 100, in its simplest form, comprises a robot gripper 102 having a vacuum tip 101 for retaining a component 104. A light holding assembly 130 has an upper portion for retaining the upper lights 112 and a lower portion for retaining lower lights 114. A beam splitter 106, preferably having a 50% mirror 116 reflects a portion of the image of the component 104 (when the upper lights 112 are on) towards a first surface mirror 105. Then, the 50% mirror 116 allows the reflection off of the first surface mirror 105 to pass through and provide an image to the lens 120 and camera 118. Likewise, referring to FIG. 3 when the lower lights 114 are on, the beam splitter 106 reflects the image of the printed circuit board 110 directly towards the lens 120 and camera 118. Thus, the image of the printed circuit board 110 (and its fiducial or landmarks) and the image of the component 104 are superimposed to provide the proper alignment before placement. The camera 118 and associated electronics can confirm that the placement of the part was correct. Thus, the present invention provides a closed loop image guided device for the pick and placement of parts. Of course, the pick and placement of all surface mounted electronics and mechanical devices onto substrates and other objects are within the contemplation of the present invention.

What is claimed is:

1. An apparatus for visually aligning parts for placement using one camera, comprising:
    means for picking and placing a part on an object within a work envelop;
    means for moving and removing optics into and out of the work envelop having the object;
    means for locating landmarks on the object within the work envelope; means for aligning the part with the landmark in the work envelope.

2. The apparatus of claim 1, wherein the means for aligning the part with the landmark comprises a superimposition of a part image with an object image.

3. The apparatus of claim 1, wherein the part comprises an electronic component.

4. The apparatus of claim 1, wherein the object comprises a printed circuit board.

5. The apparatus of claim 1, wherein the landmarks comprises solder pads.

6. The apparatus of claim 1, wherein the apparatus further comprises means for confirming the actual placement of the part on a desired location using the camera.

7. An apparatus for visually aligning parts for placement using one camera, comprising:
    means for picking and placing a part on an object within a work envelop;
    means for moving and removing optics into and out of the work envelop having the object;
    means for concurrently locating landmarks on the object and aligning the part with the landmark within the work envelope.

8. The apparatus of claim 7, wherein the means for concurrently locating landmarks comprises a superimposition of a part image with an object image.

9. The apparatus of claim 7, wherein the part comprises an electronic component.

10. The apparatus of claim 7, wherein the object comprises a printed circuit board.

11. The apparatus of claim 7, wherein the landmarks comprises fiducials.

12. The apparatus of claim 7, wherein the landmarks comprises solder pads.

13. An apparatus for visually aligning parts for placement using one camera, comprising:
    a robotic gripper for picking and placing a part on an object;
    means for concurrently superimposing landmarks on the part and on the object so as to align the part and the object in a work envelope.

14. The apparatus of claim 13, wherein the apparatus further comprises means for moving and removing optics into and out of the work envelope having the object.

15. The apparatus of claim 13, wherein the means for superimposing landmarks comprises lights for reflecting an image off the part and off the object, a beam splitter, and a mirror.

16. The apparatus of claim 13, wherein the means for superimposing landmarks comprises a backlight for producing an image off the part and a second light for producing an image off the object, a beam splitter, and a mirror.

17. The apparatus of claim 13, wherein the part comprises an electronic component.

18. The apparatus of claim 13, wherein the object comprises a printed circuit board.

19. The apparatus of claim 13, wherein the landmarks comprises fiducials.

20. The apparatus of claim 13, wherein the landmarks comprises solder pads.

* * * * *